(12) United States Patent
Nielsen et al.

(10) Patent No.: US 8,929,574 B2
(45) Date of Patent: Jan. 6, 2015

(54) HEARING AID AND A METHOD OF DETECTING AND ATTENUATING TRANSIENTS

(75) Inventors: Jakob Nielsen, Copenhagen (DK); Peter Magnus Norgaard, Frederiksberg (DK)

(73) Assignee: Widex A/S, Lynge (DK)

( * ) Notice: Subject to any disclaimer, the term of this patent is extended or adjusted under 35 U.S.C. 154(b) by 517 days.

(21) Appl. No.: 13/183,560

(22) Filed: Jul. 15, 2011

(65) Prior Publication Data

US 2011/0268301 A1    Nov. 3, 2011

Related U.S. Application Data

(63) Continuation-in-part of application No. PCT/EP2009/050593, filed on Jan. 20, 2009.

(51) Int. Cl.
| | | |
|---|---|---|
| H04R 25/00 | (2006.01) | |
| G10L 21/02 | (2013.01) | |
| H03G 9/00 | (2006.01) | |
| H03G 9/02 | (2006.01) | |
| G10L 21/0264 | (2013.01) | |
| G10L 21/06 | (2013.01) | |

(52) U.S. Cl.
CPC ............. H04R 25/356 (2013.01); G10L 21/02 (2013.01); H03G 9/005 (2013.01); H03G 9/025 (2013.01); *G10L 21/0264* (2013.01); *G10L 2021/065* (2013.01); *H04R 2225/43* (2013.01)
USPC .......................................... 381/312; 381/317

(58) Field of Classification Search
USPC ................................... 381/312, 317
See application file for complete search history.

(56) References Cited

U.S. PATENT DOCUMENTS 5,278,912 A  *  1/1994  Waldhauer .................... 381/320
5,687,241 A     11/1997  Ludvigsen
(Continued)

FOREIGN PATENT DOCUMENTS

| DE | 102005043314 A1 | 3/2007 |
|---|---|---|
| WO | WO9515668 A1 | 6/1995 |
| WO | 9818294 A1 | 4/1998 |
| WO | 2007031499 A1 | 3/2007 |

OTHER PUBLICATIONS

International Search Report for PCT/EP2009/050593 dated Oct. 5 2009.

(Continued)

*Primary Examiner* — Davetta W Goins
*Assistant Examiner* — Amir Etesam
(74) *Attorney, Agent, or Firm* — Sughrue Mion, PLLC (57) ABSTRACT

A hearing aid has means (15) for detecting fast transients in the input signal and means (16, 12, 13) for attenuating the detected transients prior to presenting the signal with the attenuated transients to a user. Detection is performed by measuring the peak difference of the signal upstream of a band split filter bank (11) and comparing the peak difference against at least one peak difference limit. Then, if a transient is detected, a state machine (20) analyzes the peak level and the absolute average level of the signal and engages a gain calculator (12) to follow either the peak level or the absolute average level of the input signal for at least the duration of the transient in order to attenuate the transient. The engagement of the gain calculator (12) is performed in each frequency band dependent of the detected transient. The invention further provides a method for detecting fast transients.

13 Claims, 8 Drawing Sheets

(56) References Cited

U.S. PATENT DOCUMENTS

| | | |
|---|---|---|
| 7,672,462 B2 | 3/2010 | Schneider et al. |
| 8,379,869 B2 | 2/2013 | Schneider et al. |
| 2005/0111683 A1 | 5/2005 | Chabries et al. |
| 2009/0154746 A1* | 6/2009 | Fischer .................. 381/317 |

OTHER PUBLICATIONS

Office Action for counterpart Chinese Application No. 200980154844.9 dated Feb. 19, 2014 with English translation.

* cited by examiner

HEARING AID AND A METHOD OF DETECTING AND ATTENUATING TRANSIENTS

RELATED APPLICATIONS

The present application is a continuation-in-part of application No. PCT/EP2009/050593, filed on Jan. 20, 2009, at The European Patent Office, and published as WO-A1-2010/083879, the contents of which are incorporated hereinto by reference.

BACKGROUND OF THE INVENTION

1. Field of the Invention

The present invention relates to hearing aids. The invention, more specifically, relates to hearing aids comprising means for dynamic modification of the input signals. The invention further relates to a method of processing signals in a hearing aid.

2. The Prior Art

In a modern hearing aid, amplification gain is set according to a prescription to accommodate the user's hearing loss, and is dynamically modified depending on the instantaneous sound level. In state-of-the-art hearing aids this is performed in respective frequency bands. The fitting of the hearing aid aims to confine the level of reproduced sounds between the hearing threshold level, HTL, which constitutes the lower limit, and the upper comfort level, UCL, which constitutes the upper limit. People with a hearing loss have a higher HTL at the frequencies where the hearing loss is present, whereas the UCL is generally less affected by the hearing loss, i.e. very loud sounds still cause approximately the same discomfort as they would to people with normal hearing. Some form of dynamic reduction, or compression, of the output signal from the hearing aid is thus necessary in order to manage larger changes in sound level without exceeding the upper comfort level. This is especially true for transient noises, which may both be very loud, and of very short duration.

Modern hearing aids usually have some way of dynamically compressing or limiting the level of the sound signals in order to keep the amplified sound from the hearing aid output transducer below the UCL. A compressor usually comprises a level detector and an amplifier with a controllable gain level. The level detector provides a measure of the general level of the input signal, e.g. the peak level, the envelope, or some average encountered during a certain time window. The compressors present in contemporary hearing aids usually have their settings optimized during the procedure of fitting the hearing aid to a user's hearing loss for the purpose of reproducing speech faithfully and comprehensible. Other sounds are of course reproduced by the hearing aid as well, but the processing quality of speech signals is paramount.

Speech signals in noise are particularly difficult to understand by a hearing impaired person, and the optimization process thus takes this factor into account when the hearing aid is fitted to the user. Transient noises pose a special problem, as they may be too short for the compressor to react upon and attenuate. Repeated transients may also reduce the amplification of the hearing aid considerably for up to several seconds after the transient sounds are over.

A lot of factors affect the quality of the resulting, gain-reduced signal. The quality of the amplifier, the speed with which the gain is reduced, and the method and the speed of detection of peaks in the input signal all have influence on the perceived quality of the reproduced signal. A slow attack-time, i.e. a low speed in reducing the gain, may result in too much gain when the input level changes from soft to loud. A slow release-time, i.e. a low speed in ramping the gain from the reduced level back up to the normal level, may result in too little gain being applied to soft sounds immediately following loud sounds.

In the present application, a hearing aid should be understood as a small, battery-powered, microelectronic device designed to be worn behind or in the human ear by a hearing-impaired user to alleviate a hearing loss. Prior to use, the hearing aid is adjusted by a hearing aid fitter according to a prescription, based on a hearing test resulting in a so-called audiogram, of the initial performance of the hearing-impaired user's unaided hearing, by amplifying frequencies in those parts of the audible frequency range where the user has difficulties in perceiving sounds. A hearing aid comprises one or more microphones, a battery, a microelectronic circuit comprising a signal processor, and an acoustic output transducer. The signal processor is preferably a digital signal processor. The hearing aid is enclosed in a casing suitable for fitting behind or in a human ear.

The microphone in the hearing aid converts sounds from the surroundings into an analog, electrical signal. The digital signal processor in the hearing aid converts the analog electrical signal from the microphone into a digital form by virtue of an analog-to-digital converter, and subsequent signal processing is carried out in the digital domain. The digital signal is split up into a plurality of frequency bands by a corresponding bank of digital band-pass filters, each band-pass filter processing a respective frequency band. The bank of band-pass filters is usually denoted a band-split filter. The signal processing in each frequency band comprises gain calculation and compression. After processing the signal in the separate frequency bands, the plurality of frequency bands are summed before converting the digital output signal into sound.

Digital hearing aids are thus capable of amplifying a plurality of different frequency bands of the input signal separately and independently and subsequently combining the resulting frequency band signals to form a coherent, audible range of frequencies for reproduction. Part of the amplification process involves a compression algorithm applied for controlling the dynamics of respective frequency bands, and the amplification gain and compressor parameters may be controlled separately for each band in order to tailor the sound reproduction to a specific hearing loss.

The compressors present in contemporary hearing aids usually have their settings optimized during the procedure of fitting the hearing aid to a user's hearing loss for the purpose of reproducing speech faithfully and comprehensibly. Other sounds are of course reproduced by the hearing aid as well, but the processing quality of speech signals is paramount. Speech signals in noise are particularly difficult to understand by a hearing impaired person, and the optimization process thus takes this factor into account when the hearing aid is fitted to the user.

It is well known that sharp transient noises do not agree well with users of hearing aids. The sounds of cutlery and dishes banging together, glasses clinking, paper crumbling, slamming doors or other loud, transient noises not only transcend the threshold of the so-called upper comfort level but are also next to impossible to eliminate by the compressors as generally used, and may be perceived as unbearable noises by the hearing aid user.

A hearing aid capable of reproducing speech in noise in a faithful and comprehensive manner while still attenuating the sharpest transients comfortably is thus desired.

WO-A1-2007031499 discloses a method and an apparatus for attenuating transient noises in a hearing aid. The method involves detecting an envelope curve of the input signal, determining the slope and/or height of an edge of the envelope curve, attenuating the output signal of the hearing device in dependence on the slope and/or height of the edge determined only in the immediate vicinity of the next zero transition of the input signal.

The apparatus, embodied as a hearing device, comprises a detecting device for detecting an envelope curve of an input signal, a data processing device for determining the slope and/or height of the edge of the envelope curve and an attenuating device for attenuating the output signal of the hearing device.

This method has the drawback of having to analyze and extract five different parameters of the input signal, an envelope curve, a slope, a signal peak, an edge presence and a zero transition. The method also has the added complexity of having to calculate the precise attenuation level for each signal peak to be dampened. Furthermore, a zero crossing rule is no guarantee that clicks are not produced by the system, as a change in the slope at the zero crossing of the waveform due to attenuation may still introduce clicks and artefacts into the reproduced sound. A simpler and faster system for detecting and dealing with fast transient peaks in the input signal in a hearing aid is thus desired.

SUMMARY OF THE INVENTION

The invention, in a first aspect, provides a hearing aid comprising a microphone, a signal processor and an output transducer, said signal processor having a filter bank for splitting an input signal into a plurality of frequency channel input signals, and a summer for summing output signals from said channels, each frequency channel comprising a channel sound level calculator, a channel gain calculator and a channel amplifier, each of the channel sound level calculators being adapted for deriving a set of parameters from the channel input signal, each channel gain calculator being adapted for dynamically controlling the gain of each channel amplifier, and each channel amplifier being adapted for processing signals according to a user's prescription, each channel gain calculator and the respective channel amplifier together forming a channel compressor, wherein the signal processor comprises a transient detector placed upstream of the filter bank, said transient detector having means for determining the slope of the input signal and providing a signal to each channel sound level calculator if the slope of the input signal exceeds a predetermined value, each channel sound level calculator being adapted for controlling the compression speed of the channel gain calculator and the channel amplifier in the respective frequency channel based on the derived set of parameters.

This configuration provides the hearing aid processor with a sufficiently fast-responding transient detector in order to take adequate action and alter the behavior of the gain calculators in the plurality of frequency channels in such a way that transient signals are treated differently than speech signals. Given the fact that speech signals only have transients rising slower than e.g. 160.000 dB/s, corresponding to 5 dB/sample at a sample rate of 32 kHz, all transients above a certain level rising faster than 5 dB/sample may thus be detected and treated in this way by the transient detector according to the invention.

In a preferred embodiment, the gain calculator comprises a 90% percentile estimator. This percentile estimator outputs an envelope of the signal by following the signal level in such a way that rising signal values make the envelope value rise as fast as the signal level while falling signal values make the envelope value fall by a fixed time constant. The time constant is selected in such a way that the average level of the percentile estimator roughly equals 90% of the signal energy. A percentile estimator of this kind is, for instance, described in WO-A1-95/15668.

In a second aspect, the invention provides a method of processing transient signals in a hearing aid, said method comprising the steps of detecting a transient in the input signal, splitting the input signal into a plurality of frequency bands and processing each of the frequency bands, said processing involving the steps of deriving a set of band parameters from the band input signal, calculating and applying a band gain level to the signal in each of the frequency bands according to a user's prescription, wherein the step of calculating and applying a band gain level involves the step of compressing transient sounds according to the level of the transient and the levels of the derived set of band parameters, and adding the output signals from each of the respective frequency bands together for reproduction by the hearing aid.

Further features and advantages appear from the dependent claims.

In a digital hearing aid, the signal is sampled according to the Nyquist criterion, i.e. the sample rate is twice the highest frequency in the signal to be reproduced. If, for instance, the signal is sampled at 32 kHz, the highest frequency that may be reproduced will be 16 kHz. Experience has shown that transient peaks having a slope higher than 160.000 dB/second are practically absent in speech sounds, but frequently occurring in other sounds. Thus a slope level detector in a transient detection system in a digital hearing aid performing at a sample rate of 32 kHz may beneficially be configured to react on slopes higher than 5 dB/sample.

If the slope level detector were allowed to react to any slope above 5 dB/sample, too many fast transients at very low levels would be detected. Therefore a sound level limit is introduced in the transient detection system, below which limit transients are not detected.

BRIEF DESCRIPTION OF THE DRAWINGS

The invention will now be explained in further detail with respect to the drawings, where.

DETAILED DESCRIPTION OF THE INVENTION

Figure 1:
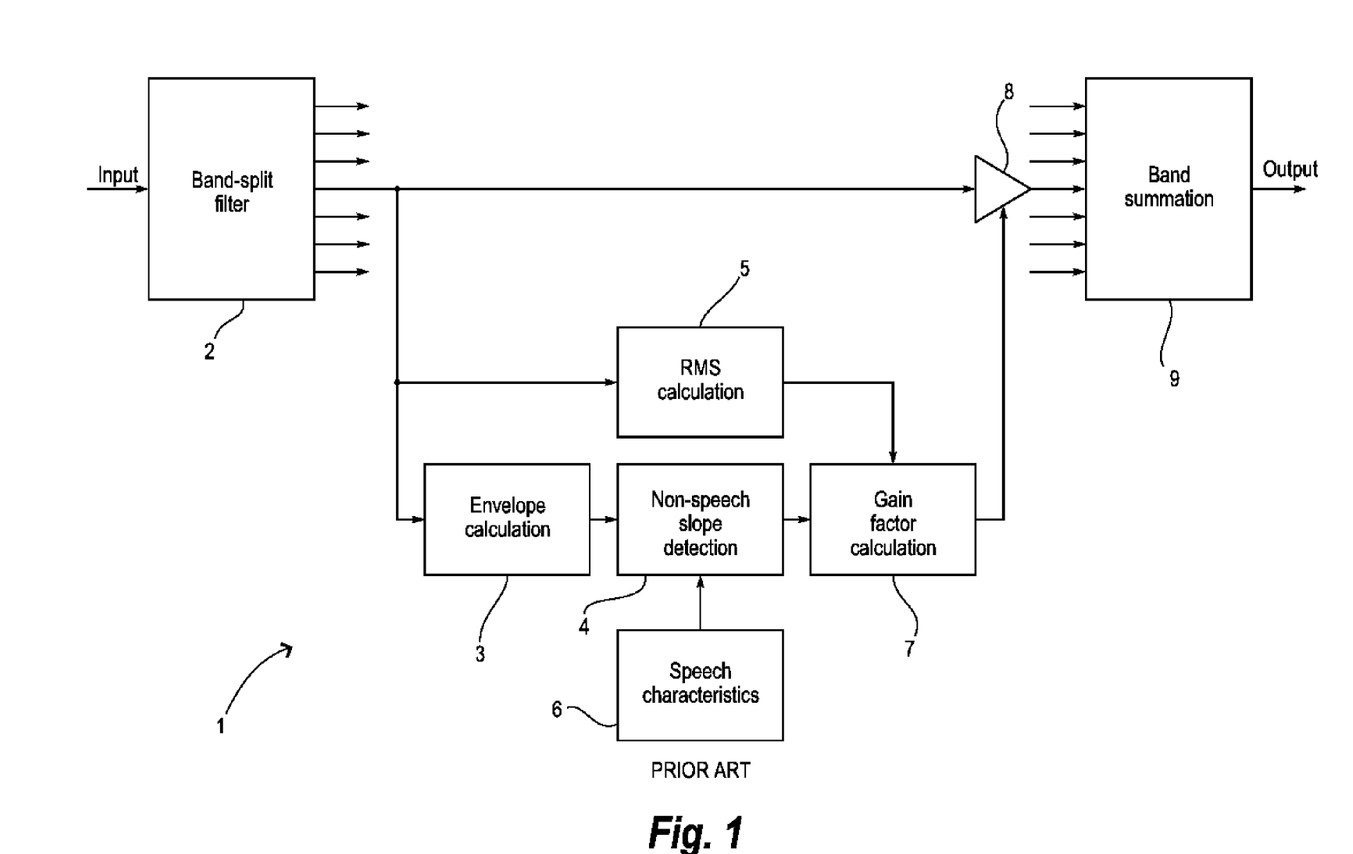
FIG. 1 is a transient detection and attenuation device for a hearing aid, according to the prior art.

In FIG. 1 is shown a block schematic of a prior art transient detection and attenuation device 1 for a hearing aid. The input is connected to a band-split filter block 2, splitting the usable frequency range of the input signal into a plurality of frequency bands. Each frequency band of the plurality of frequency bands has its own detection and attenuation means each comprising an envelope calculation block 3, a non-speech slope detection block 4, an RMS calculation block 5, a speech characteristics input block 6, and a gain factor calculation block 7. Only one exemplified, arbitrary frequency band is shown in FIG. 1, the remaining frequency bands being suggested for clarity. The output of the detection and attenuation means 3, 4, 5, 6, 7, is a gain value, which is used to amplify the signal of the particular frequency band in an amplifier 8. The result of this amplification in the plurality of frequency bands is recombined in a band summation block 9, which is common to the plurality of frequency bands.

The signals from each of the frequency bands from the band-split filter 2 are split up into two branches, namely a gain calculation branch, for calculating the gain factor in case of a transient occurring in the particular frequency band, and a signal branch for carrying the signal to have its gain modified in the gain multiplier 8. Furthermore, the gain calculation branch is split up into two branches, one branch going to the input of the RMS calculation block 5, and the other branch going to the input of the envelope calculation block 3.

The RMS calculation block 5 outputs the instantaneous RMS value of the signal in the particular band, and this value is used directly in the gain factor calculation block 7. The envelope calculation block 3 outputs the instantaneous envelope value, i.e. peak value, of the signal in the particular frequency band, and this value is used in the non-speech slope detection block 4 together with the signal from the speech characteristics input block 6. The speech characteristics input block 6 presents a maximum slope value for speech, which is characteristic for the particular frequency band, to the non-speech slope detection block 4, and if the slope value from the envelope calculation block 3 has a steeper slope than the slope value limit set by the speech characteristics input block 6, a signal is given to the gain factor calculation block 7. The gain factor calculation block 7 combines this signal with the RMS value from the RMS calculation block 5 and decreases the gain factor accordingly, thus dampening the signal in the particular frequency band.

When in use, the transient detection and attenuation device 1 in FIG. 1 splits an input signal up into a plurality of individual frequency bands in the band-split filter 2. The envelope calculation block 3, the RMS calculation block 5, and the non-speech slope detection block 4 monitors the signal in each frequency band of the plurality of frequency bands continuously, and if a non-speech transient signal is detected in a particular frequency band, the gain factor calculation block 7 decreases the gain value output to the amplifier 8 in that frequency band during a short period of time until the next zero crossing of the signal. This results in the gain being lowered in that particular frequency band during that short period of time, and the transient signal is thus dampened.

However, this prior art method has several drawbacks. The complexity of the transient attenuation device 1 makes it difficult to implement effectively in a hearing aid, where power consumption should be kept to a minimum in order to prolong battery life. A complex circuit with a lot of semiconductor elements uses up a considerable amount of power in order to operate, and a transient attenuation device 1, which may comprise a band-split filter 2 with e.g. sixteen channels or frequency bands, each channel having its own transient detection system, obviously constitutes a highly complex circuit consuming a lot of power.

Circuit topologies involving placing a compressor sensitive to transients only, upstream to the filter bank or downstream to the point where the frequency bands are added back together, are possible, but impractical for a number of reasons. A separate, full-band compressor placed either before the band-pass filters or after the recombination point in the signal chain and adjusted correctly could possibly dampen the loudest transients, but not without upsetting the balance of the carefully adjusted performance of the signal, deteriorating the sound quality and the speech comprehension severely.

In the system according to the prior art, where transient analysis is performed downstream to the band-split filter, transient detection is thus performed on a filtered signal. This approach may deteriorate the transients in the signals the system is designed to alleviate in unpredictable ways, dampening some transients to a level below detection and amplifying other transients to a level above detection, thus confusing the decision process of the transient detection and attenuation device, deteriorating the resulting sound output from the hearing aid.

If the point where transients are detected is placed as far upstream in the signal flow as possible, the transients detected would be as faithful to the actual input signal as possible. The transients could then easily be processed in the individual frequency bands downstream to the filter bank. The realization of the fact that the detection of transient sounds may be performed at another point in the signal chain in a hearing aid than the processing of transient sounds is the key to the working principle of the hearing aid according to the invention.

Figure 2:
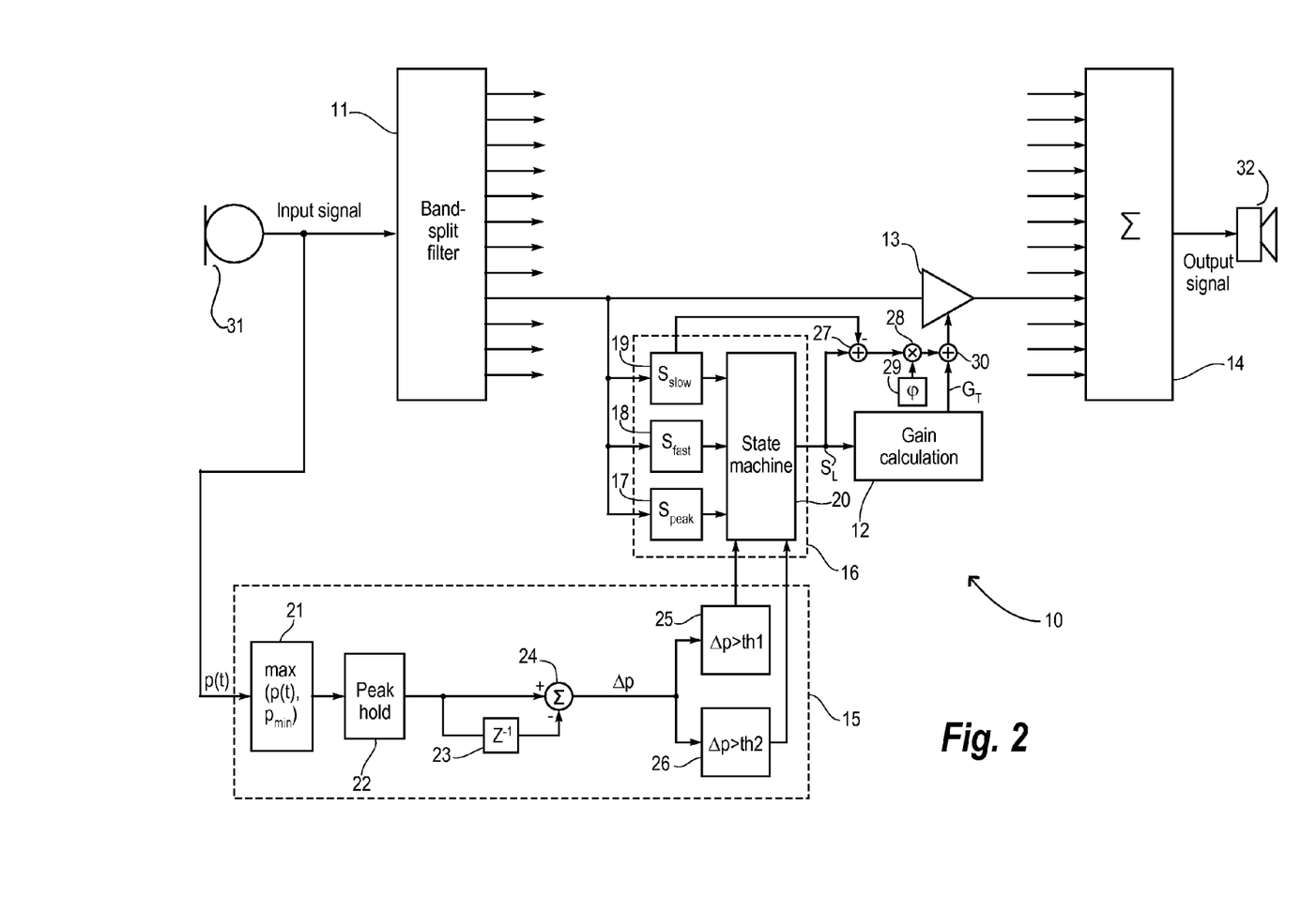
FIG. 2 is a transient detection and processing device for a hearing aid, according to an embodiment of the invention.

A preferred embodiment of a signal processor comprising a transient detection and processing device for use in a hearing aid according to the invention is shown in FIG. 2. The signal processor comprises a band split filter bank 11 receiving an input signal from microphone 31, a channel amplifier 13, a summation block 14 for providing an output signal to an output transducer 32, and a transient detection and attenuation device 10. The transient detection and processing device 10 comprises a transient detection block 15, a sound level calculation block 16, a gain calculation block 12, a difference node 27, a constant block 29, a multiplication node 28 and a summation node 30. The transient detection block 15 comprises a gate block 21, a peak hold block 22, a unit delay block 23, a difference node 24, a first threshold comparator block 25, and a second threshold comparator block 26. The sound level calculation block 16 comprises a peak level measurement block 17, a fast level measurement block 18, a 90% percentile level measurement block 19, and a state machine 20.

The input signal is fed to the band-split filter bank 11 and to the input of the transient detection block 15. In the filter bank 11, the signal is split into a plurality of frequency bands for individual processing in each channel by the sound level calculation block 16 and the channel amplifier 13.

In the transient detection block 15, transients in the input signal are detected in the following way: The gate block 21 prevents all transients below a predetermined level $p_{min}$ from being detected by the transient detection block 15. This is performed by comparing the input signal p(t) to the constant limit $p_{min}$ and outputting the largest of the two values. This feature ensures that only transients loud enough to be disturbing to the user are processed by the transient detection and attenuation system 10. After the gate block 21, the signal is fed to the peak hold block 22. The purpose of the peak hold block 21 is to generate a positive envelope of the transient signals in order to stabilize the detection process.

The output signal from the peak hold block 21 is branched into one input signal for the unit delay block 23 and another input signal for the difference node 24. The output from the unit delay block 23 is subtracted from the output signal from the peak hold block 22 in the difference node 24 in order to form a peak difference signal, Δp. The peak difference signal Δp is branched into two signals and fed to the inputs of the first threshold comparator block 25 and the second threshold comparator block 26, respectively.

In the first threshold comparator block 25, the peak difference signal Δp is compared against a peak difference threshold th1. If the peak difference signal Δp is above th1, a signal is sent to the state machine 20 of the sound level calculation block 16 that a fast transient is detected. In the second threshold comparator block 26, the peak difference signal Δp is compared against a peak difference threshold th2. If the peak difference signal Δp is above th2, a signal is sent to the state machine 20 of the sound level calculation block 16 that a peak transient is detected. The values of th1 and th2 may be constants, or they may be made dependent on the input signal in order for the transient detection and attenuation system 10 to keep the sensitivity of the detection system stable in varying sound levels.

The state machine 20 in the sound level calculation block 16 uses the signals from the transient detection block 15 together with the signals from the peak level measurement block 17, the fast level measurement block 18, and the 90% percentile level measurement block 19 to decide which type of compression to let the gain calculation block 12 and the amplifier 13 apply to the signal.

The 90% percentile level measurement block 19 generates the signal $S_{slow}$, which is used by the state machine 20 to determine a first compression type for use when no transients are present in the input signal. The signal $S_{slow}$, is a rather slow changing signal, taking several seconds to apply a change in gain when the signal level reaches a compression limit. As a consequence, the signal $S_{slow}$ is far too slow to be capable of attenuating transients by compressing the input signal in the particular channel.

The fast level measurement block 18 generates the signal $S_{fast}$, which is used by the state machine 20 in conjunction with the signal from the first threshold comparator block 25 of the transient detection block 15 to determine a second compression type for use when fast transients are present in the input signal. The signal $S_{fast}$ only takes a few milliseconds to apply a change in gain when the signal level reaches a compression limit. The signal $S_{fast}$ is fast enough for attenuating transient sounds with peak difference values between 4 dB/sample and 5 dB/sample at a sample rate of 32 kHz.

The peak level measurement block 17 generates the signal $S_{peak}$, which is used by the state machine 20 in conjunction with the signal from the second threshold comparator block 26 of the transient detection block 15 to determine a third compression type for use when peak transients are present in the input signal. The signal $S_{peak}$ only takes a few samples to apply a change in gain when the signal level reaches a compression limit. Because the band split filter bank 11 has an inherent delay of a few samples in relation to the transient detection block 15, the signal $S_{peak}$ is fast enough for attenuating transient sounds with peak difference values above 5 dB/sample at a sample rate of 32 kHz.

Additionally, in order for the system to be capable of attenuating transients which may be annoying to people with a supernormal sensitivity towards transient noises (not at all uncommon among the hearing-impaired), a small additional network for this precise purpose is present in the system according to the invention. This network comprises summation nodes 27 and 30 together with a constant 29 and a multiplicator 28. The signal $S_{slow}$ from the 90% percentile block 19 is subtracted from the signal $S_L$ from the sound level calculation block 16 in the summation node 27, multiplied with a constant φ from the constant block 29 in the multiplier 28 and added to the gain level $G_T$ from the gain level calculation block 12 in the summation node 30. The resulting gain level presented to the amplifier 13 is then:

$$gain = gain - (S_L - S_{slow}) \cdot \phi$$

Where φ is a positive constant close to zero, chosen by the fitter of the hearing aid in proportion to how uncomfortable transient sounds are perceived by the user of the hearing aid. This enables a higher compression ratio to be used in each of the frequency bands when transients are detected in the input signal than the compression ratio used in the normal state.

In this context, it is practical to classify non-speech transients into two different categories, in the following denoted fast transients and peak transients, respectively. Speech transients are considered to be all transients with rise times below 160.000 dB/s. Fast transients are non-speech transients with rise times from around 160.000 dB/s to approximately 450.000 dB/s, and although this range comprises the strongest speech transients this is not considered a problem because such strong speech transients are rarely occurring in practice. The necessary changes in the compression settings are considered small enough not to be a problem in the reproduction of speech. Peak transients, however, having rise times from 450.000 dB/s to maybe 650.000 dB/s, demand a shorter reaction time and dictates a more profound change in the compression settings in order to accommodate and dampen the fast transients. This classification of non-speech transients is used to control the gain calculation block 12 in the transient attenuation system 10 according to the invention.

The sound level calculation block 16 performs three different types of analysis of the signal in the particular frequency band in order to provide information to the gain calculation block 12 about which type of gain reduction is appropriate in a particular situation. The first analysis is a peak level measurement, performed by the peak level block 17, providing the signal $S_{peak}$. The signal $S_{peak}$ follows the fastest peaks in the signal. The second analysis is a fast level measurement, performed by the fast level block 18 providing the signal $S_{fast}$ This signal follows the average level of the signal. The third analysis is a 90% percentile level measurement, performed by the 90% percentile level block 19 providing the signal $S_{slow}$. This signal follows the 90% percentile level of the signal, i.e. the level the signal has in 90% of the time seen over an arbitrary time window.

In the preferred embodiment shown in FIG. 2, three gain reduction states are utilized in the state machine 20; a normal compression state, a fast transient state, and a peak transient state. The normal compression state uses the signal $S_{slow}$ to control the gain level, the fast transient state uses the signal $S_{fast}$ to control the gain level, and the peak transient state uses the peak signal $S_{peak}$ to control the gain level. Finer subdivisions of gain reduction states are perfectly possible in alternate embodiments of the invention, and may, for instance, turn out to be an advantage to users who are hypersensitive to transient noises, as explained previously. For the sake of clarity, only the embodiment having three gain reduction states is discussed here.

The term peak-diff is used in the following to denote the difference in peak level, Δp, between two consecutive samples. The term peak-offset is used to denote an offset introduced in order to make the difference between the $S_{peak}$ signal level and the $S_{fast}$ signal level smaller to facilitate to the return of the transient attenuation system to normal compression speed as soon as possible after a transient sound is over. In this embodiment, peak-offset has a magnitude of about −3 dB.

The state machine 20 carries out a decision about the appropriate gain level from the levels analyzed by the blocks 17, 18, 19 and the transient detection output from the transient detection block 15.

The state machine 20 outputs a speed level signal $S_L$ according to one of three different states controlling the performance speed of the gain calculation block 12, a normal state, a fast transient state, and a peak transient state. While no transients are detected, the sound level from the state machine is controlled by the level of the signal $S_{slow}$. When a fast transient is detected, the sound level follows the largest value of the signal levels $S_{slow}$ and $S_{fast}$. When a peak transient is detected, the sound level follows the largest value of the signal levels $S_{slow}$, $S_{fast}$ and $S_{peak}$. The interpretation of the signal levels by the state machine 20 is presented in table 1 and explained in greater detail in the following.

TABLE 1

| Signal interpretation by State Machine | Previous state | Current state | Control |
|---|---|---|---|
| $\Delta p > 5$ dB/sample | Normal | Peak Transient | $S_{peak}$ |
| $\Delta p > 4$ dB/sample | Normal | Fast Transient | $S_{fast}$ |
| $S_{fast}$ value $> S_{peak}$ minus peak-offset | Peak Transient | Fast Transient | $S_{fast}$ |
| $S_{slow} > S_{fast}$ AND $S_{slow} > S_{peak}$ minus peak-offset | Peak Transient | Normal | $S_{slow}$ |
| $S_{slow} > S_{fast}$ | Fast Transient | Normal | $S_{slow}$ |
| $\Delta p > 5$ dB/sample | Fast Transient | Peak Transient | $S_{peak}$ |

When a peak transient is present in the input signal, the state of the state machine 20 changes from the normal state to the peak transient state and makes the sound level $S_L$ follow $S_{peak}$ for controlling the gain calculation block 12

When a fast transient is present in the input signal, the state of the state machine 20 changes from the normal state to the fast transient state and makes the sound level $S_L$ follow $S_{peak}$ for controlling the gain calculation block 12.

When a transient is decaying, the abs-average value $S_{fast}$ of the input signal is larger than the peak-offset and the state of the state machine 20 changes from the peak transient state to the fast transient state and makes the sound level $S_L$ follow $S_{fast}$ for controlling the gain calculation block 12.

When the level of the signal $S_{slow}$ is larger than both the peak-offset and the level of the signal $S_{fast}$ in the peak transient state, the state of the state machine 20 changes directly from the peak transient state to the normal state and makes the sound level $S_L$ follow $S_{slow}$ for controlling the gain calculation block 12. This rather rarely occurring event implies that a large signal level is present in the input signal and the level of the peak is below that signal level.

When the level of the signal $S_{slow}$ is larger than the level of the signal $S_{fast}$ in the fast transient state, the state of the state machine 20 changes from the fast transient state to the normal state and makes the sound level $S_L$ follow $S_{slow}$ for controlling the gain calculation block 12. This means that a fast transient is no longer present in the input signal, or at least that its level is below the average signal level.

When the loudest part of the transient sound is over in the peak transient state, the state of the state machine 20 changes from the peak transient state to the fast transient state and makes the sound level $S_L$ follow $S_{fast}$ for controlling the gain calculation block 12.

When the state machine 20 enters either the fast transient state or the peak transient state, a delay timer (not shown) starts counting down from a predetermined number towards zero. The state machine 20 does not change its gain updating speed until this counter has reached zero, even if the condition interpreted by the state machine 20 implies it. This feature introduces a hysteresis into the transient attenuation system serving to secure that the gain calculation block 12 is held in one of the transient suppressing states for a minimum duration of, say, 2000 to 3000 consecutive samples, equal to between about 60 and 90 milliseconds at a sample rate of 32 kHz. Transients occurring within this time window are ensured to be attenuated by either the fast algorithm or the peak algorithm.

This ensures that the actual reaction speed of the transient detection and attenuation device 10 is not affected by the delay inherent in the band-split filter 11, as transients in the signal are detected before the signal is processed by the band-split filter 11. When detected transients in the signal reaches the amplifier 13, the gain calculation block 12 is therefore already prepared to attenuate them.

During the period of the delay timer, i.e. whenever a fast or a peak transient has been detected and is being processed by the system, the signal $S_{slow}$ from the 90% percentile level measurement block 19 is not updated. If the signal was updated during transient processing, the level of the signal $S_{slow}$ would be higher when the transient was over, and the overall sound thus attenuated by the normal compression process. The subjective effect would be that any transient sound would be followed by a brief silencing of sounds, maybe lasting up to a couple of seconds.

When the signal has been amplified in each individual frequency band by the amplifier 13, the individual frequency bands are added back together in a summation block 14 in order to produce an output signal comprising the plurality of frequency bands. In FIG. 2, only one channel carrying one frequency band into the sound level calculation block 16, the gain calculation block 12 and the amplifier 13 is shown.

In the normal compression state, the gain reduction in the particular frequency band equals the gain level and accompanying compression specified during fitting. Whenever the signal level reaches the limit of the compressor, the gain level is reduced accordingly by the gain calculation block 12 in the particular frequency band. In the peak transient state, peak transients detected by the transient detection block 15 are suppressed by the gain calculation block 12, and in the fast transient state, fast transients detected by the transient detection block 15 are suppressed by the gain calculation block 12.

The fact that transient detection takes place before the band split filter bank 11 improves the potential reaction time due to the fact that the signal takes a finite amount of time to pass through the band split filter 11, the amplifier 13, and the summation point 14. The processing time of the transient detection block 15 is considerably shorter, and this improves the reaction time of the gain calculation block 12, practically making transients predictable to the system.

Figure 3:
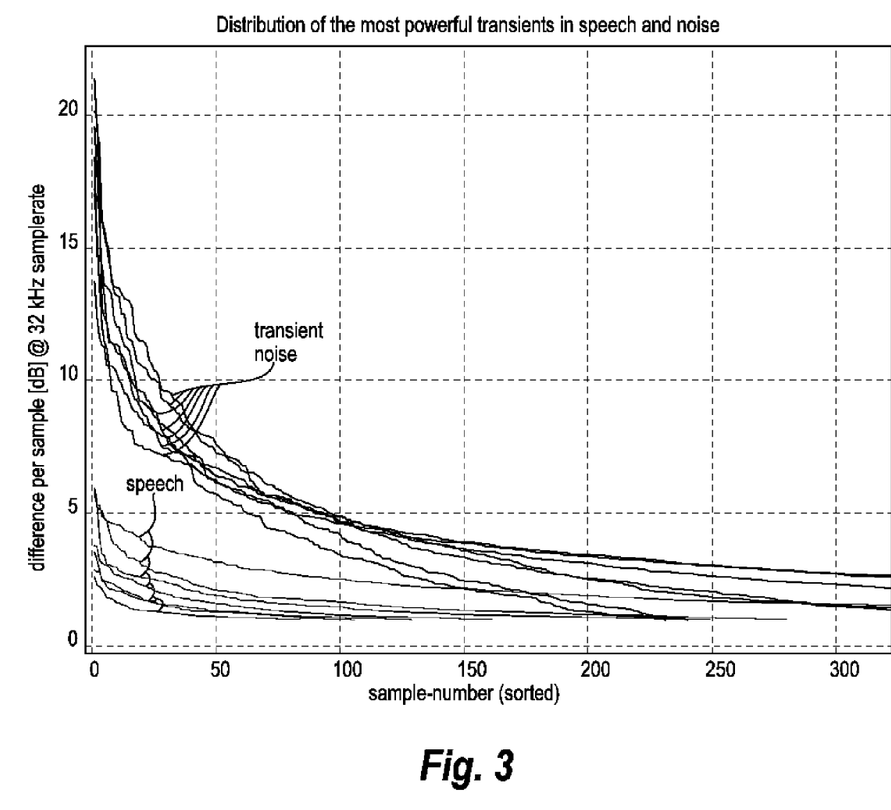
FIG. 3 is a graph showing the level increment per sample versus transient sounds, sorted after size, taken from a representative selection of sounds.

FIG. 3 shows a graph of the statistical distribution of the most powerful transients in speech and various forms of transient noise. A set of sound examples, each comprising 320 individual signal sample values, corresponding to 0.1 seconds of sound at a sample rate of 32 kHz, have been recorded from a number of different, transient sound sources and spoken words, and subsequently sorted decreasingly by gradient value, i.e. difference between two sorted sample values. The graph illustrates the difference between transients in speech and transients in other sounds.

Two important facts may be learned from the graph in FIG. 3. The first fact is that non-speech transients have a considerably faster rise time than speech transients, and the second fact is that speech transients practically never rise faster than 160.000 dB/s, or 5 dB/sample at a sample rate of 32 kHz. This knowledge is exploited in the transient detector and the transient detection block according to the invention, where a limit of 5 dB/sample may beneficially be used as the limit in the transient detection block 15 shown in FIG. 2 for the purpose of separating speech transients from non-speech transients. By using the knowledge gathered from FIG. 3 to provide parameters for the transient detector, a secure way of detecting peaks in a signal without influence from the speech transients present in the signal is made possible.

The signals derived from the input signal by the transient detection block 15 in FIG. 2 and used for the transient analysis and detection process in the hearing aid according to the invention represents a simplified real-time model of the behaviour of the input signal with respect to transient signals. This model then forms the basis of decisions made by the gain calculation block 12 regarding deviations in the compression scheme from the compression defined in the prescription for the purpose of reducing the discomfort of transient reproduction in the hearing aid according to the invention. A more elaborate explanation of the derived signals is explained in the following with respect to FIGS. 4, 5, 6, 7, and 8.

Figure 4:
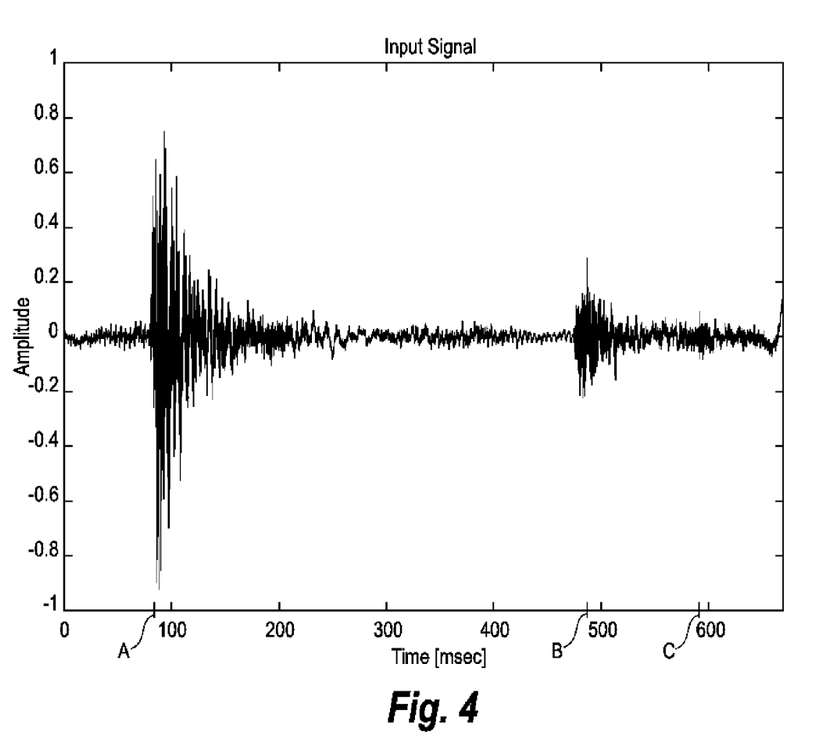
FIG. 4 is an oscillogram of the level of an input signal over time in a hearing aid.

FIG. 4 is an oscillogram of the level of a sample of an input signal in a hearing aid. The sample has a duration of approximately 700 milliseconds. The sample shown in the oscillogram in FIG. 4 comprises three transient events. In the following discussion of FIGS. 4, 5, 6, 7, and 8, all timings are referenced to the start of the sample. At a first point A, at 80 milliseconds, a loud transient occurs in the input signal, at a second point B, at 470 milliseconds, a second, smaller transient occurs, and at a third point C, at 590 milliseconds, a third, yet smaller transient occurs. The way the transient detection and attenuation system according to the invention processes the transients in the input signal is explained in further detail in the following.

Figure 5:
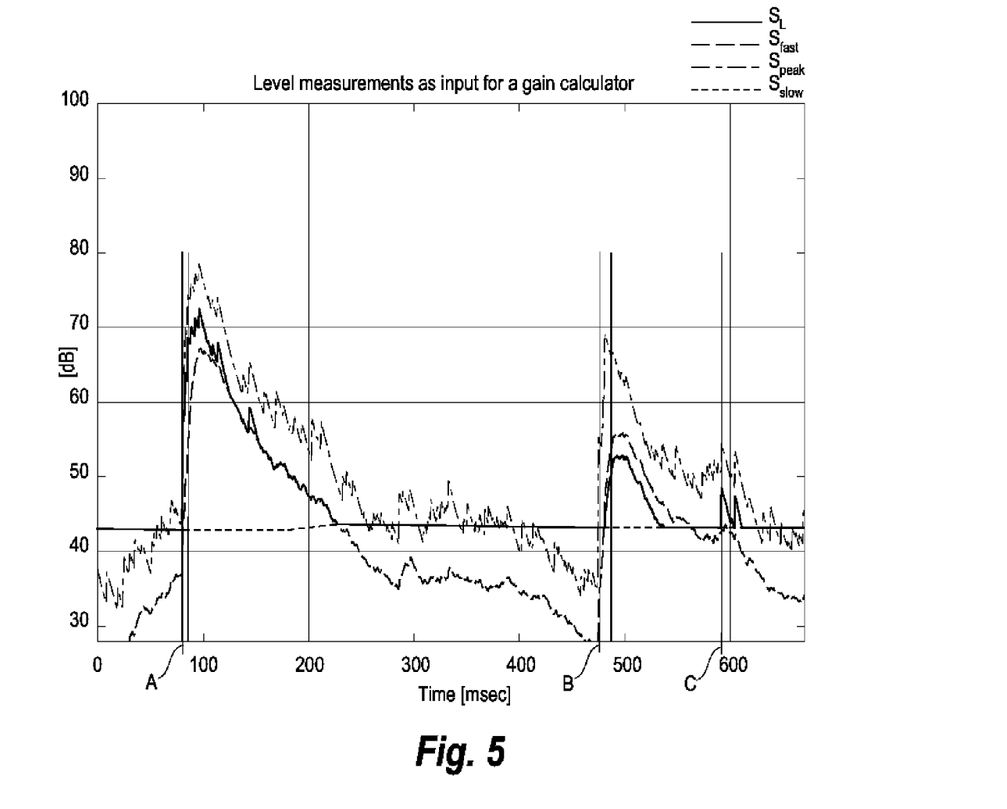
FIG. 5 is a graph of a set of level measurements over time, corresponding to the input signal in FIG. 4.

FIG. 5 is a graph of a set of four level measurement signal graphs corresponding to the sample of the input signal in FIG. 4. These signals are used as control signals for the compressor in the hearing aid according to the invention. The first graph is the signal $S_L$, shown in a solid line. The second graph is the signal $S_{fast}$, shown in a dashed line. The third graph is the signal $S_{peak}$, shown in a dash-dotted line. The fourth graph is the signal $S_{slow}$, shown in a dotted line.

The graph of the first signal $S_L$ in FIG. 5, shown in a solid line, represents the sound level control signal as calculated by the sound level calculation block 16 in FIG. 2. Before the first transient, the level of the signal $S_L$ follows the level of the signal $S_{slow}$ closely. At the start of the first transient, at the point A, the level of $S_L$ rises sharply with the transient to about 72 dB in order to follow the level of the signal $S_{peak}$. At 160 milliseconds, the level of the signal $S_L$ coincides with the level of the signal $S_{fast}$. At about 220 milliseconds, the level of $S_L$ reaches the level of the signal $S_{slow}$ again. At the start of the second transient, at the point B, the level of the signal $S_L$ rises with the transient to about 52 dB, and at 530 milliseconds, the level of $S_L$ has fallen down to the level of $S_{slow}$ again. At the start of the third transient, at the point C, the level of $S_L$ rises sharply twice to about 48 dB, but falls quickly down to the level of $S_{slow}$ again at about 610 milliseconds. Thus, the level of $S_L$ follows the level $S_{peak}$, but cannot become lower than the level of $S_{slow}$.

The graph of the second signal $S_{fast}$ in FIG. 5, shown in a dashed line, represents the abs-average level of the signal. The level of $S_{fast}$ is below 40 dB until the first transient occurs. At the start of the first transient, at the point A, the level of the signal $S_{fast}$ rises sharply and follows the transient to about 68 dB, then falls down again following the level of $S_L$ approximately, the level of $S_{fast}$ crossing the level of $S_L$ at about 220 milliseconds, and falling below 30 dB. At the start of the second transient, at the point B, the level of the signal $S_{fast}$ rises to about 55 dB. At the start of the third transient, at the point C, the level of $S_{fast}$ barely touches the level of $S_{slow}$.

The graph of the third signal $S_{peak}$ in FIG. 5, shown in a dash-dotted line, represents the peak level of the signal. The peak level represents the absolute peak volume level of the input signal and forms the envelope of the signal in the particular frequency band. The peak level is used by the sound level calculation block 16 to determine the actual input level, here denoted the sound level, for the gain calculation block 12 in order to follow and dampen the fastest and loudest transients in the signal.

The graph of the fourth signal $S_{slow}$ in FIG. 5, shown in a dotted line, represents the 90% percentile level of the signal. The 90% percentile level is the limit that the signal stays below in 90% of the time. This graph of $S_{slow}$ is coincident with the graph of the signal $S_L$ except where the level of the signal $S_L$ is higher than the level of $S_{slow}$. The signal $S_{slow}$ is a rather slow-changing signal, and furthermore has a release time about ten times slower than its attack time, i.e. it rises about ten times faster than it falls.

In order to prevent the transient sounds from lowering the overall sound level, the value of the signal $S_{slow}$ is held constant whenever peaks are detected, and released again when the hysteresis of the system times out. This may be seen in the graph, where the signal $S_{slow}$ rises a few dB at approximately 190 milliseconds, i.e. after the transient event is over, in response to the slightly increased overall sound level.

Figure 6:
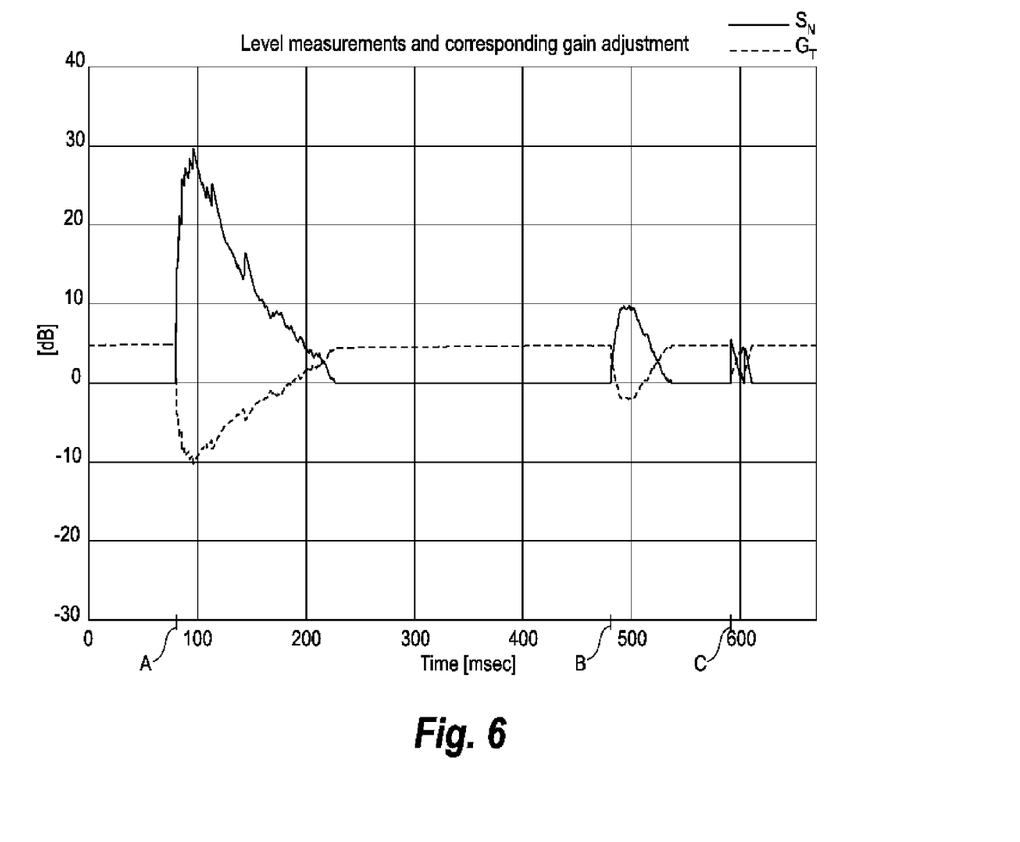
FIG. 6 is a graph of a set of input levels for a compressor over time, and the corresponding gain level.

From the three level measurement signals $S_{slow}$, $S_{fast}$ and $S_{peak}$ shown in FIG. 5, the gain calculation block 12 in FIG. 2 calculates an intermediate signal $S_N$ and a corresponding gain level signal $G_T$. This is illustrated by the graph in FIG. 6, corresponding temporally to the graph of the sample of the input signal in FIG. 4 and the graph of the level measurement signals in FIG. 5. The first signal $S_N$, illustrated by a solid line in FIG. 6, is calculated as the level of the signal $S_L$ minus the signal $S_{slow}$ in order to get a representation of the sound level above the 90% percentile, i.e. the 90% percentile is filtered out from the sound level signal. This signal is denoted the normalized sound level signal $S_N$ in FIG. 6 and is used for calculating the gain adjustment.

The second signal $G_T$, illustrated by a dotted line in FIG. 6, represents the resulting gain level signal calculated from the normalized sound level $S_N$ in one of the plurality of frequency bands. The gain adjustment level for the amplifier 13 calculated by the gain calculation block 12 in response to transients in the input signal is apparent from the graph of the level of the signal $G_T$ in FIG. 6, and is explained in further detail in the following.

The gain level $G_T$ is steady at about +5 dB, corresponding to approximately 1.8 times amplification, for the first approximately 80 milliseconds of the sample of the input signal, until the onset of the first transient at the point A, cf. FIG. 4. At the start of the first transient at the point A, the level of the signal $S_N$ rises sharply to about +30 dB. The net result is that the transient detection and attenuation device performs a corresponding reduction of the gain level in order to attenuate the detected transient. The gain level $G_T$ is lowered from about +5 dB to approximately −10 dB in this case, i.e. the gain is reduced by 15 dB, or to a sixth of the original value, in order to accommodate the transient. The amount of gain reduction is dependent on the gain level and the gain attenuation factor in that particular frequency band. About 230 milliseconds into the sample the gain level recovers $G_T$ to the level of +5 dB where it was before the transient occurred. In this way, transient sounds are attenuated without affecting the overall sound level in the particular frequency band.

At the point B, the second transient occurs, cf. FIG. 4. The second transient causes the level of the signal $S_N$ in FIG. 6 to rise sharply again to about +10 dB, i.e. 20 dB below the first transient. The gain level $G_T$ of +5 dB is reduced to about −2 dB, as the second transient has a considerably lower level. At about 540 milliseconds, the gain level $G_T$ is back to the level of +5 dB where it was before the transient occurred.

At the point C, the third transient occurs, cf. FIG. 4. The third transient causes the level of the signal $S_N$ to rise sharply to about +5 dB at 590 milliseconds, and fall back to zero at about 600 milliseconds. As a result, the gain level $G_T$ is briefly reduced to about +1 dB and then brought back to its nominal level of +5 dB where it was before the third transient occurred. The reason is that the level of the signal $S_N$ is higher when the transient occurs, and the system reacts accordingly. This behavior is in compliance with the perception of a relatively fast transient in a louder, overall sound environment by a person having normal hearing.

As may be learned from FIG. 6, the level of a detected transient determines how the transient attenuation system subsequently deals with attenuating the transient. Both loud transients and softer transients are immediately attenuated by the system, but the degree of attenuation depends on the nature of the transient.

Figure 7:
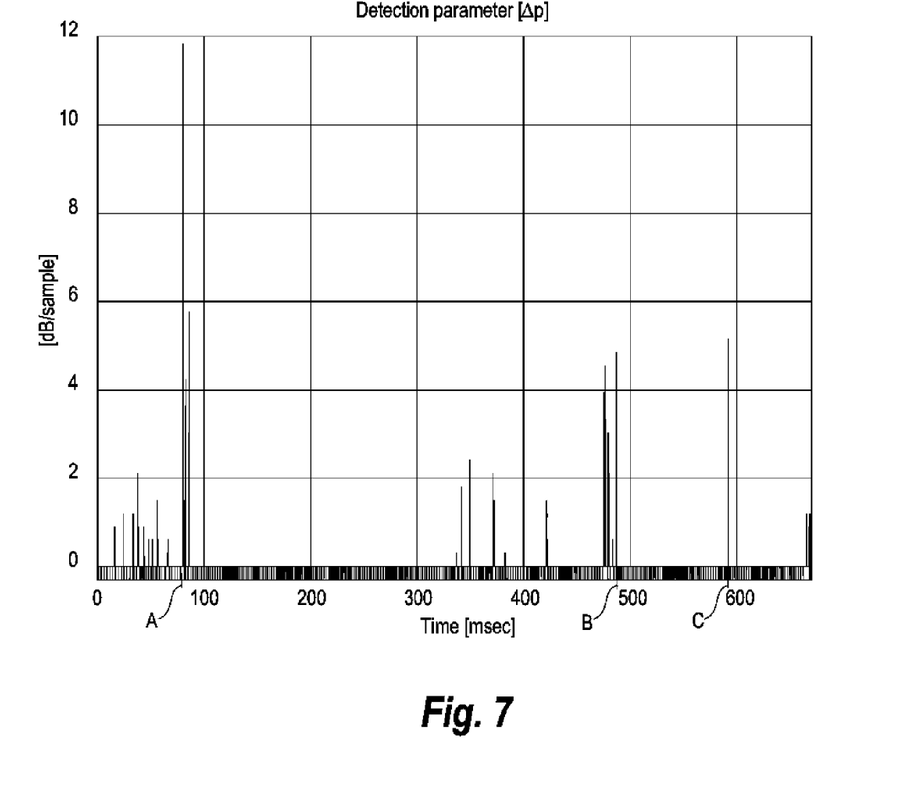
FIG. 7 is a graph of a detector parameter corresponding to the level measurements in FIG. 6.

A graph showing the transient detection activity during the sample of the input signal is shown in FIG. 7. This graph, showing the peak difference Δp, corresponds temporally to FIGS. 4, 5, and 6, including the transient events at A, B and C. The graph illustrates the difference between two adjacent sample values expressed in dB/sample at a sample rate of 32 kHz. The graph may be viewed as the difference quotient of the peak level of the signal as depicted in the dash-dotted graph in FIG. 5, thus indicating a measure of how fast the inter-sample signal peak values change.

In FIG. 7, the first approximately 80 milliseconds of the graph of Δp shows sporadic peak difference values below 2 dB/sample. At the first transient event of FIG. 4, at the point A, the graph of Δp indicates one event of approximately 12 dB/sample and several successive events above 4 dB/sample, indicative of a loud peak transient. This triggers the peak transient attenuation response in the transient detection block 15 in FIG. 2. At the second transient event of FIG. 4, at the point B, the graph of Δp in FIG. 7 shows several events of about 3-4 dB/sample. This triggers the fast transient attenuation response in the transient detection block 15 in FIG. 2. At the third transient event of FIG. 4, at the point C, the graph of Δp in FIG. 7 shows a single transient event above 5 dB/sample, and the peak transient attenuation response is thus triggered briefly.

From FIG. 7 it may also be learned that it is inadequate just to detect transients, as they are very frequently occurring. A minimum rise level of the detected transients has to be taken into consideration for the system to have proper stability. Whenever the transient detection block 15 in FIG. 2 detects a transient event, the levels of the signals $S_{peak}$, $S_{slow}$ and $S_L$ are analyzed on a running basis by the sound level calculation block 16 in order to calculate the amount of gain reduction needed to properly attenuate the detected transient.

Figure 8:
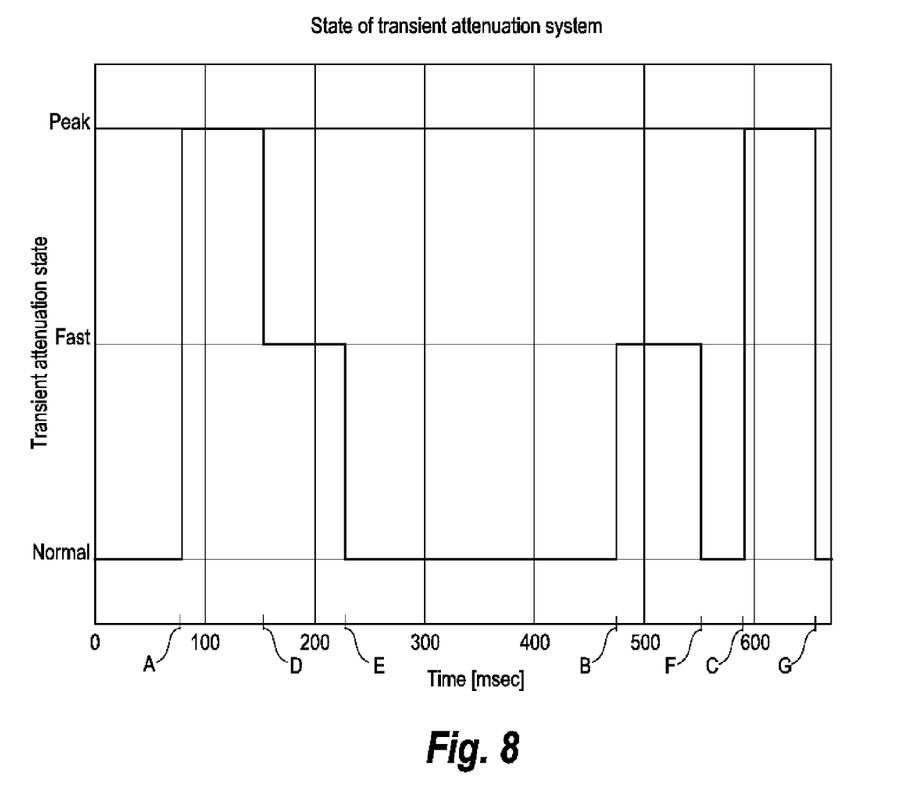
FIG. 8 is a graph of the state of the transient attenuation system according to the invention.

The graph in FIG. 8 shows three states of the transient attenuation system, i.e. 'normal' compression, fast transient attenuation and peak transient attenuation. The timings in the graph corresponds to the timings in FIGS. 4, 5, 6 and 7. Apart from the annotations of the three transients at the points A, B and C, repeated from FIGS. 4, 5, 6 and 7, four points D, E, F and G, not related to detection of any transients in the input signal, are also shown in the graph in FIG. 8. These points illustrates the shifting from a transient detection state into another transient detection state, or into the normal state. When in use, the transient attenuation system switches between these three states according to the analysis of the input signal through the parameters derived therefrom as discussed previously.

The two transient attenuation states allow for the gain calculation block 12 in FIG. 2 to attenuate transient signals either in the fast transient attenuation state following the signal $S_{fast}$ for controlling the gain level $G_T$ or the peak attenuation state following the signal $S_{peak}$ for controlling the gain level $G_T$. In the normal state, the gain calculation block 12 follows the signal $S_{slow}$ for calculating gain level.

Up until the first transient, the transient attenuation system is in the normal state in the graph in FIG. 8. The gain calculation performs compression of the signal according to the changes in the level of the signal $S_{slow}$. When the first transient occurs, at the point A in FIG. 8, the transient attenuation system at first switches into the peak transient attenuation state. At the point D, at 150 milliseconds, the system changes into the fast transient attenuation state because the level of the $S_{peak}$ signal minus peak-offset is below or equal to the level of the signal $S_{fast}$, cf. FIG. 5 and table 1, and the peak transient hysteresis has timed out at this point. When the level of the signal $S_N$ have reached zero (as shown in FIG. 6) and the fast transient hysteresis has timed out, the transient attenuation system switches to the normal state at the point E, at approximately 220 milliseconds.

When the second transient occurs, at the point B in FIG. 8, the transient attenuation system switches into the fast transient attenuation state. This occurs because a fast transient is detected, i.e. the transient at B is below the threshold for peak transient attenuation, cf. FIG. 6 and FIG. 7. When the normalized sound level have reached zero, and the fast hysteresis has timed out, at about 560 milliseconds, the transient attenuation system switches back into the normal state at the point F.

When the third transient occurs, at the point C, the transient attenuation system switches into the peak transient attenuation state in FIG. 8. The third transient is very short and soft when compared to the overall signal level, so the gain is only attenuated by the transient attenuation system for a very brief period of time, and the normalized sound level reaches zero almost immediately, and the peak transient hysteresis times out at approximately 670 milliseconds, at the point G, where the transient attenuation system switches back into the normal state. It should be noted that the gain is only reduced during the short period where the normalized sound level (as shown in the solid-line graph in FIG. 5) is above zero, even though the system is in the peak transient detection state until the point G.

From the graph in FIG. 8 may also be learned that a certain period of time, denoted the transient state hysteresis time, has to elapse in either of the two transient attenuation states before a switching to either of the transient attenuation states or to the normal state is carried out. The presence of this time period is explained in the following. The detection of transients is performed upstream of the filter bank 11 in FIG. 2. The transient detection block 15 has a short inherent delay between the moment a transient is presented at the input of the transient detection block 15 and its appearance at the output. The filter bank also has an inherent delay in the signal processing, denoted the group delay. However, the inherent delay of the filter bank is longer than the delay inherent delay of the transient detection block 15.

When a transient in the input signal is detected, the transient detection block 15 puts the state machine in the fast transient attenuation state or the peak transient attenuation state as described previously. When the input signal containing the transient leaves the band split filter block 11, the transient attenuation block 16 still has to be in one of the two transient attenuation states. The transient state hysteresis time ensures that a transient is still being attenuated even if the transient detection block 15 indicates to the state machine 20 that the transient is over. Otherwise the transient attenuation block 16 would return to the normal state before the transient in the signal leaves the band split filter, and the transient would not be attenuated.

The benefit of the switching between the three different compression states in this way is that louder and faster transients in the input signal are dampened effectively by the system without affecting other sounds. The reason for including a third state for soft transients is to maintain a smooth transition in an unsteady sound environment with a lot of transient sounds occurring at random. The result is a hearing aid with a more pleasant and comfortable overall sound, even when large gain factors are required by the prescription for the hearing aid.

We claim:

1. A hearing aid comprising a microphone, a signal processor and an output transducer, said signal processor having a filter bank for splitting an input signal into a plurality of time domain frequency channel input signals, and a summer for summing output signals from said channels, each frequency channel comprising a channel sound level calculator, a channel gain calculator and a channel amplifier, each of the channel sound level calculators being adapted for deriving a set of parameters from the channel input signal, each channel gain calculator being adapted for dynamically controlling the gain of each channel amplifier, and each channel amplifier being adapted for processing signals according to a user's prescription, each channel gain calculator and the respective channel amplifier together forming a channel compressor, wherein the signal processor comprises a transient detector placed upstream of the filter bank, said transient detector having means for determining the slope of the input signal and providing a signal to each channel sound level calculator if the slope of the input signal exceeds a predetermined value, each channel sound level calculator being adapted for controlling the compression speed of the channel gain calculator and the channel amplifier in the respective frequency channel based on the derived set of parameters, wherein each of the channel sound level calculators has means for activating at least one channel transient-attenuating setting in the respective channel gain calculator.

2. The hearing aid according to claim 1, wherein each of the means for activating at least one channel transient-attenuating setting has means for maintaining a channel transient-attenuating setting for a predetermined time period.

3. The hearing aid according to claim 2, wherein each of the means for maintaining a channel transient-attenuating setting for a predetermined time period has means for suppressing updating of the channel percentile level for at least the duration of the predetermined time period.

4. The hearing aid according to claim 2, wherein each of the channel gain calculators has means for applying a dedicated channel compression ratio to the channel input signal whenever one of the channel transient-attenuating settings is activated.

5. A method of processing transient signals in a hearing aid, said method comprising the steps of detecting a transient in the input signal, splitting the input signal into a plurality of time domain frequency band signals and processing each of the frequency band signals, said processing involving the steps of deriving a set of band parameters from the band input signal, calculating and applying a band gain level to each of the frequency band signals according to a user's prescription, wherein the step of calculating and applying a band gain level involves the step of compressing transient sounds according to the level of the transient and the levels of the derived set of band parameters, and adding the output signals from each of the respective frequency bands together for reproduction by the hearing aid, wherein the step of detecting a transient in the input signal involves classifying the transient into one of a plurality of predetermined transient classes, and wherein the step of calculating the band gain level involves the steps of determining to which one of the plurality of predetermined transient classes a transient belongs, and selecting one gain reduction strategy among a corresponding plurality of gain reduction strategies in dependence of the transient class.

6. The method according to claim 5, wherein the predetermined transient classes comprises at least one speech transient class and at least one non-speech transient class.

7. The method according to claim 5, wherein the predetermined transient classes comprises one speech transient class and two non-speech transient classes.

8. The method according to claim 6, wherein the selected gain reduction strategy is maintained for a predetermined period after the end of a detected transient.

9. The method according to claim 8, wherein updating of the band percentile level value is suppressed during the processing of a detected transient.

10. The method according to claim 5, wherein the gain reduction strategy involves controlling the band gain according to the peak level of the band input signal.

11. The method according to claim 5, wherein the gain reduction strategy involves controlling the band gain according to the band absolute average level of the band input signal.

12. The method according to claim 5, wherein the gain reduction strategy involves controlling the band gain by compressing the dynamic range of the detected transient using the selected gain reduction strategy during the predetermined period.

13. The method according to claim 5, wherein a dedicated compression ratio is applied to the band input signal whenever one of the transient-attenuating settings is activated.

* * * * *